(12) United States Patent
Andersen et al.

(10) Patent No.: US 6,656,751 B2
(45) Date of Patent: Dec. 2, 2003

(54) SELF TEST METHOD AND DEVICE FOR DYNAMIC VOLTAGE SCREEN FUNCTIONALITY IMPROVEMENT

(75) Inventors: John E. Andersen, Essex Junction, VT (US); Bruce M. Cowan, Essex Junction, VT (US); Pamela S. Gillis, Jericho, VT (US); Steven F. Oakland, Colchester, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 09/683,050

(22) Filed: Nov. 13, 2001

(65) Prior Publication Data

US 2003/0090295 A1 May 15, 2003

(51) Int. Cl.[7] ........................ H01L 21/00; H01L 21/66
(52) U.S. Cl. .......................... 438/14; 716/5; 716/7; 716/18; 716/19; 714/30; 714/721; 714/733; 365/201
(58) Field of Search ................. 438/14; 716/5, 716/7, 18, 19; 714/30, 714, 721, 727, 731–734; 365/201; 330/2

(56) References Cited

U.S. PATENT DOCUMENTS

| | | | |
|---|---|---|---|
| 3,605,022 A | | 9/1971 | De Fillipo et al. |
| 3,805,243 A | | 4/1974 | Boisvert, Jr. |
| 5,181,191 A | * | 1/1993 | Farwell ....................... 368/113 |
| 5,455,917 A | * | 10/1995 | Holeman et al. ........... 395/287 |
| 5,761,214 A | * | 6/1998 | Ford et al. .................. 371/22.6 |
| 5,794,175 A | * | 8/1998 | Conner ........................ 702/119 |
| 5,796,745 A | * | 8/1998 | Adams et al. .............. 371/21.1 |
| 5,861,774 A | * | 1/1999 | Blumenthal .................... 330/2 |
| 5,903,502 A | * | 5/1999 | Porter ........................ 365/201 |
| 5,918,003 A | * | 6/1999 | Koch et al. ............ 395/183.06 |
| 6,072,357 A | * | 6/2000 | Jo ............................... 327/536 |
| 6,115,763 A | * | 9/2000 | Douskey et al. .............. 710/72 |
| 6,158,029 A | * | 12/2000 | Richter et al. ............... 714/718 |
| 6,181,617 B1 | * | 1/2001 | Beigel et al. ................ 365/201 |
| 6,363,520 B1 | * | 3/2002 | Boubezari et al. ............ 716/18 |
| 2002/0053056 A1 | * | 5/2002 | Kuegler et al. ............. 714/733 |

OTHER PUBLICATIONS

IBM Technical Disclosure Bulletin, "Test System Control Technique Detecting Potential Short Circuit Defects by Use of a Voltage Screen", Jan. 1986, p. 1.
International Application Published under the Patent Cooperaton Treaty, PCT/US90/01799, Apr. 5, 1990, Deluca, et al.

* cited by examiner

Primary Examiner—Matthew Smith
Assistant Examiner—Granvill D Lee, Jr.
(74) Attorney, Agent, or Firm—Schmeiser, Olsen & Watts; Robert A. Walsh

(57) ABSTRACT

Disclosed is a device that includes a built-in-self-test controller having a mechanism for providing an interface signal that indicates whether a dynamic voltage screen (DVS) test is being performed. The self-test controller is associated with a memory array that includes a clock having a clock speed. The memory array also includes a clock adjuster that receives the interface signal and reduces the clock speed when the interface signal indicates that a DVS test is being performed.

13 Claims, 5 Drawing Sheets

SELF TEST METHOD AND DEVICE FOR DYNAMIC VOLTAGE SCREEN FUNCTIONALITY IMPROVEMENT

BACKGROUND OF THE INVENTION

1. Technical Field

This invention generally relates to semiconductor devices, and more specifically relates to self-test devices for memory arrays.

2. Background Art

The proliferation of modern electronics is due in large part to the development of the integrated circuit (IC). IC designs are implemented on a silicon die by mapping logic functions to a set of pre-designed, pre-verified logic circuits. These circuits range from the simplest functions to highly complex circuits referred to as "cores." Cores are typically high level industry-standard functions, such as a digital signal processor (DSP), an advanced RISC machines (ARM) microprocessor, an Ethernet function, or a peripheral component interconnect (PCI) controller. With a particular design in mind, customers can quickly assemble an application specific IC, or ASIC, design by using cores as building blocks.

One of the more commonly used cores are those that provide memory arrays for use in ASICs. Typically, memory cores are designed to be compilable, i.e., the parameters of the memory array can be customized to meet the requirements of a particular design. Typically, a compilable memory core allows the design to specify parameters such as the number of words and the width of the words. Additionally, compilable memory array cores typically allow designers to specify decode options and other parameters. Thus, one ASIC memory array core can provide memory structures for a wide variety of applications.

Modern memory arrays commonly include self-test circuitry designed to facilitate testing of the memory array after fabrication. These devices, typically referred to as "built-in-self-test" (BIST) controllers, provide the memory core with the ability to perform self tests to determine which cells in the memory are functioning properly. Typically, these BIST controllers provide the ability to perform a test pattern routing that involves writing to each memory cell in the array, and then reading from the cells to determine which cells are operating properly. In particular, the BIST controller writes a defined pattern into the memory, and reads the data back from the array. The read data is then compared to the "expect data" by a self test comparator within the memory array, and the memory sends back a pass/fail signal. The BIST then logs the pass/fail, and uses that information to determine whether the memories embedded within the ASIC are functional.

Memory arrays have many applications, and come in many forms. In order to accommodate a maximum number of users, some memory arrays, such as SRAM designs, are required to operate over a wide range of power and temperature conditions. A robust testing procedure for this and other memory arrays includes test coverage through Level Sensitive Scan Design (LSSD), Extended Voltage Screen (EVS), and Dynamic Voltage Screen (DVS). In order for SRAM designs to be tested at DVS they must be fully functional up to voltages much higher than those used during normal operation. The intent of the DVS test is to find resistive-type defects that do not necessarily cause a "hard" struck-type fail. This type of fail is sensitive to the higher power supply during the DVS test, and the slower timing utilized is not significant relative to AC defects. The integrity of the DVS test is, therefore, preserved.

Existing self test methods and devices are flawed in that they require that critical timing elements be tuned to be slower than might otherwise be needed to ensure that data is written and read during DVS test. This compensates for the speed up effects at higher voltage, thus avoiding undesirable race conditions that would render the memory array inoperable. This extra delay, added for the sole purpose of making the design functional at DVS test conditions, becomes more pronounced at normal and low operating voltages, which translates to much slower functional memory access and cycle times.

SUMMARY OF THE INVENTION

Therefore, there exists a need for a self test method and apparatus capable of optimum functionality both at DVS test and normal operating conditions. The present invention fills that need by providing a device that includes a built-in-self-test controller having a mechanism for providing an interface signal that indicates whether a DVS test is being performed. The self-test controller is associated with a memory array that includes a clock having a clock speed. The memory array also includes a clock adjuster that receives the interface signal and reduces the clock speed when the interface signal indicates that a DVS test is being performed.

This configuration provides tester control for a new capability which is provided to the memory array designer. Specifically, it allows the selection within the array of a slower clock delay or modified internal clock waveform during DVS, such that two timings are available. The normal (faster) array timing can be tuned to function at the conditions that a customer would use. For DVS test, the slower timing may be used. This would allow additional delay or a modified pulse to be selected, allowing the array to be functional at DVS conditions. With this approach, a performance advantage in smaller delays and cycle time is realized for the user since it is not necessary to add additional delay for functional mode.

BRIEF DESCRIPTION OF THE DRAWINGS

The foregoing and other features and advantages of the invention will be apparent from the following more particular description of specific embodiments of the invention, as illustrated in the accompanying drawings, wherein.

DETAILED DESCRIPTION OF EMBODIMENTS OF THE INVENTION

Figure 1:
FIG. 1 is a truth table describing various modes for an element of the present invention.

The present invention provides a device that includes a built-in-self-test controller having a mechanism for providing an interface signal that indicates whether a DVS test is being performed. The self-test controller is associated with a memory array that includes a clock having a clock speed. The memory array also includes a clock adjuster that receives the interface signal and reduces the clock speed when the interface signal indicates that a DVS test is being performed.

A DVS test is designed to stress interconnects between various levels of metal, the levels of metal themselves, or devices, to screen out weaknesses. During test, the entire part is brought up to a higher voltage than its normal operating voltage, causing more current to flow through the metal and the interconnects than would normally be the case. There are certain types of reliability defects that will only cause a memory to fail during the DVS test. This means that only DVS test will catch defects of this kind. A goal of this invention is to modify the internal timings of the memory in order for the memory to be functional at elevated voltage so that these reliability defects can be found. After DVS test, the device is run through another test at normal voltage in order to determine which, if any, parts failed the test. Thus DVS test is used as a screen to detect defects that cause the memory to be non-functional at high operating voltages.

In one embodiment of the invention, a specialized BIST controller, called "multiple-array-built-in-self-test" (MABIST) controller, may be used to generate test patterns for one or more memory arrays, such as an SRAM. The MABIST controller may be an LSSD design initialized by an LSSD scan operation. Using signals supplied to the MABIST controller, namely TESTM1 and TESTM3, and a new LSSD scannable latch value within the MABIST controller, a new MABIST interface signal called MI05 is logically generated.

This new MI05 interface signal provides tester control for a new capability which is provided to the memory array designer, namely, the selection within the array of a slower clock delay or modified internal clock waveform during DVS, such that two timings are available. The normal (faster) array timing can be tuned to function at the conditions that a customer would use. MABIST may be run, such that this normal timing is utilized, when the scannable latch is set to a logical "0" during MABIST scan-initialization. For DVS test, MABIST may be run with the slower timing by setting the scannable latch to a logical "1" during MABIST scan-initialization. This would allow additional delay or a modified pulse to be selected, allowing the array to be functional at DVS conditions.

With this approach, a performance advantage in smaller delays and cycle time is realized for the user since it is not necessary to add additional delay for functional mode. MABIST is also allowed to test the array with the faster timing, and will do so at normal operating voltages. During DVS test, the array is tested with MABIST, but with the additional delay added, or with a modified timing pulse. During normal operating voltage range, MABIST, and all other test modes, the faster timing path in the array is used.

Referring now to the figures, and in particular to FIG. 1, a truth table 10 describes functional and various test modes, and displays the added capability to distinguish between two modes of running MABIST. One mode, titled "normal MABIST mode," would select the normal SRAM timings, while the other mode, titled "MABIST with modified timing," would allow the previously-described modified slower SRAM timings. Although the modified timing MABIST mode may be used at DVS, it may not necessarily be required. This will depend upon the particular SRAM design, as well as its intended market segment. The present invention is flexible enough that functionally equivalent SRAMs, i.e., 1-port high performance SRAMs and 1-port low-power SRAMs, may share the same MABIST controller, whether or not they make use of the MI05 signal. SRAMs that do not make use of the MI05 signal will have the MI05 input pin, but the signal will stop there.

An SRAM that makes use of the MI05 pin may utilize MI05 to select various timing circuits that can be used as an alternative during DVS test so that the clock speed may be slowed such that the test may be performed accurately. During normal operation, on the other hand, the faster timings that the part was designed for may be used, thus enhancing performance.

Referring still to FIG. 1, when running MABIST, TESTM1 (pin MI03) is set to logical "1," or high, and TESTM3 (pin MI04) is set to logical "0," or low. The scannable latch value determines what timing is used during MABIST. By adding TESTM1 ("1") and the inversion of TESTM3 ("1"), and a "1" scanned into the latch during MABIST scan-initialization, the active ("1") MI05 pin is used by the SRAM to control a multiplexor (see FIG. 2) through which two versions of the clock signal can pass. During functional mode and all test modes with the exception of DVS, pin MI05 would be low, enabling the normal clock timings to the SRAM. During MABIST at the DVS conditions, extra delay and/or pulse width would be added to the clock path to ensure proper functionality.

Figure 2:
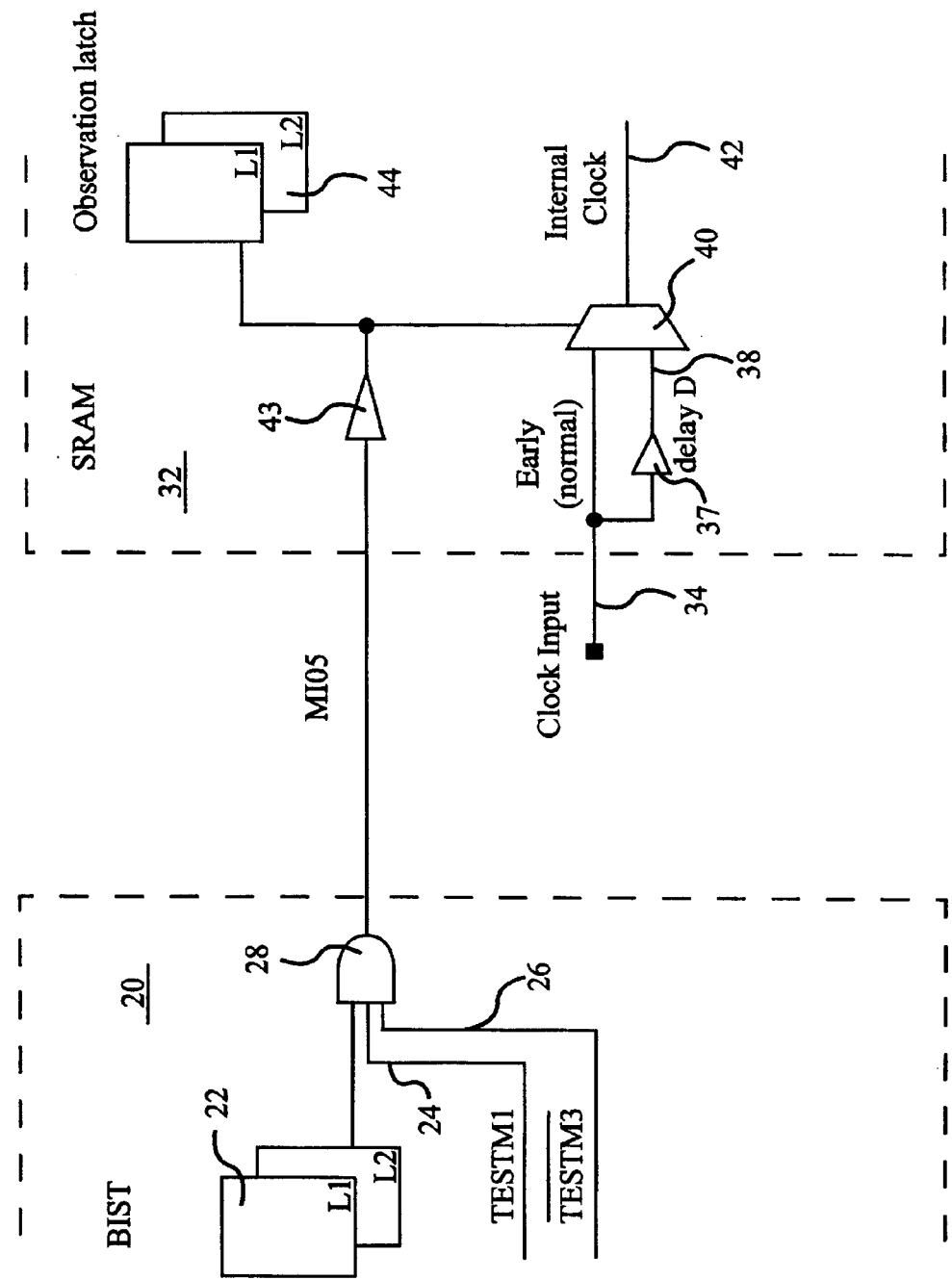
FIG. 2 is a view of a device that implements the method of the present invention configured according to an embodiment of the present invention.

In FIG. 2, a BIST structure 20 includes a scannable latch 22, a first input 24, and a second input 26. In this embodiment of the invention, a DVS selected clock may be delayed as appropriate for DVS test. Scannable latch 22, and first and second inputs 24 and 26 each feed into an AND-gate 28. BIST structure 20 may in one embodiment be a MABIST structure capable of connecting to multiple SRAMs. An interface signal MI05 couples BIST structure 20 with SRAM 32. A clock input 34 supplies clock timings to SRAM 32.

Interface signal MI05 determines the timing used during MABIST by controlling a multiplexor 40 through which the early (normal) version 34 and a delayed version 38 of the clock signal can pass on the way to an internal clock 42. Delayed version 38 may be delayed by passing the clock signal through a buffer 37. In one embodiment, buffer 37 may comprise a string of invertors, but any other buffering device may also be used.

Figure 3:
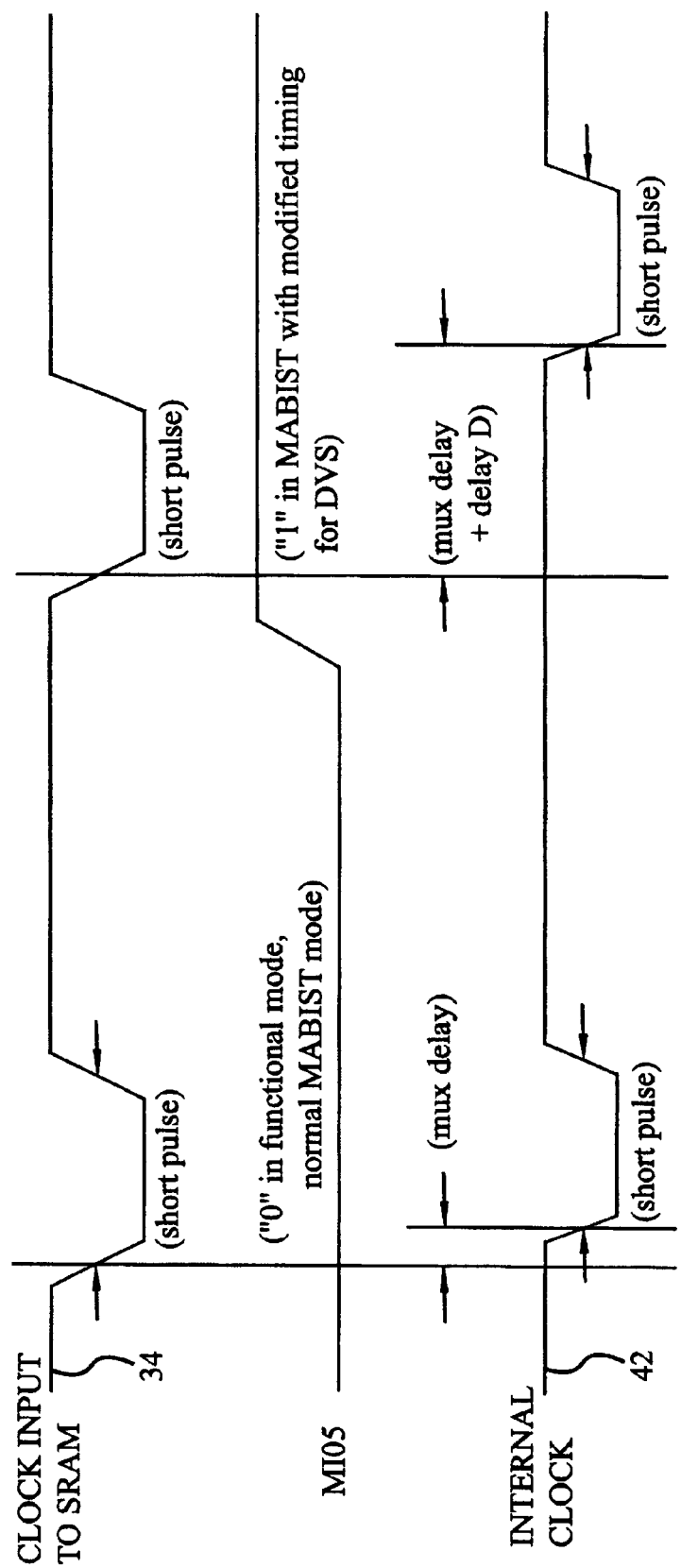
FIG. 3 is a view of the waveforms generated by the device of FIG. 2.

An observation latch 44 may be coupled to multiplexor 40. Observation latch 44 becomes useful during logic test, where it may be necessary to observe buffer 43 just before observation latch 44, in order to ensure that the MI05 pin is working. As part of an LSSD logic test, observation latch 44 may be loaded and then scanned out to make sure that the value in the latch is as expected. FIG. 3 shows waveforms corresponding to the arrangement of FIG. 2.

Figure 4:
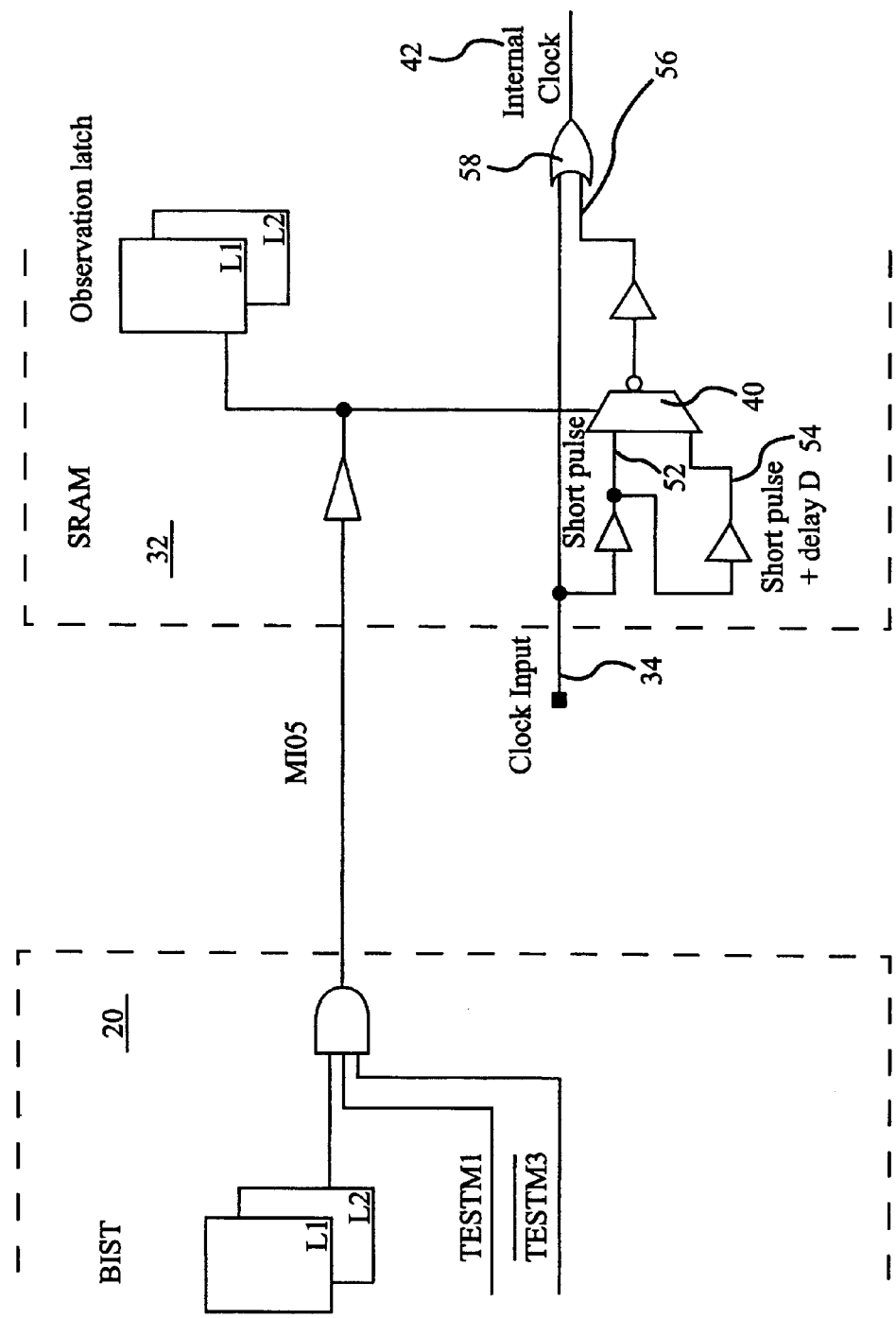
FIG. 4 is a view of a device that implements the method of the present invention configured according to a different embodiment of the present invention.
Figure 5:
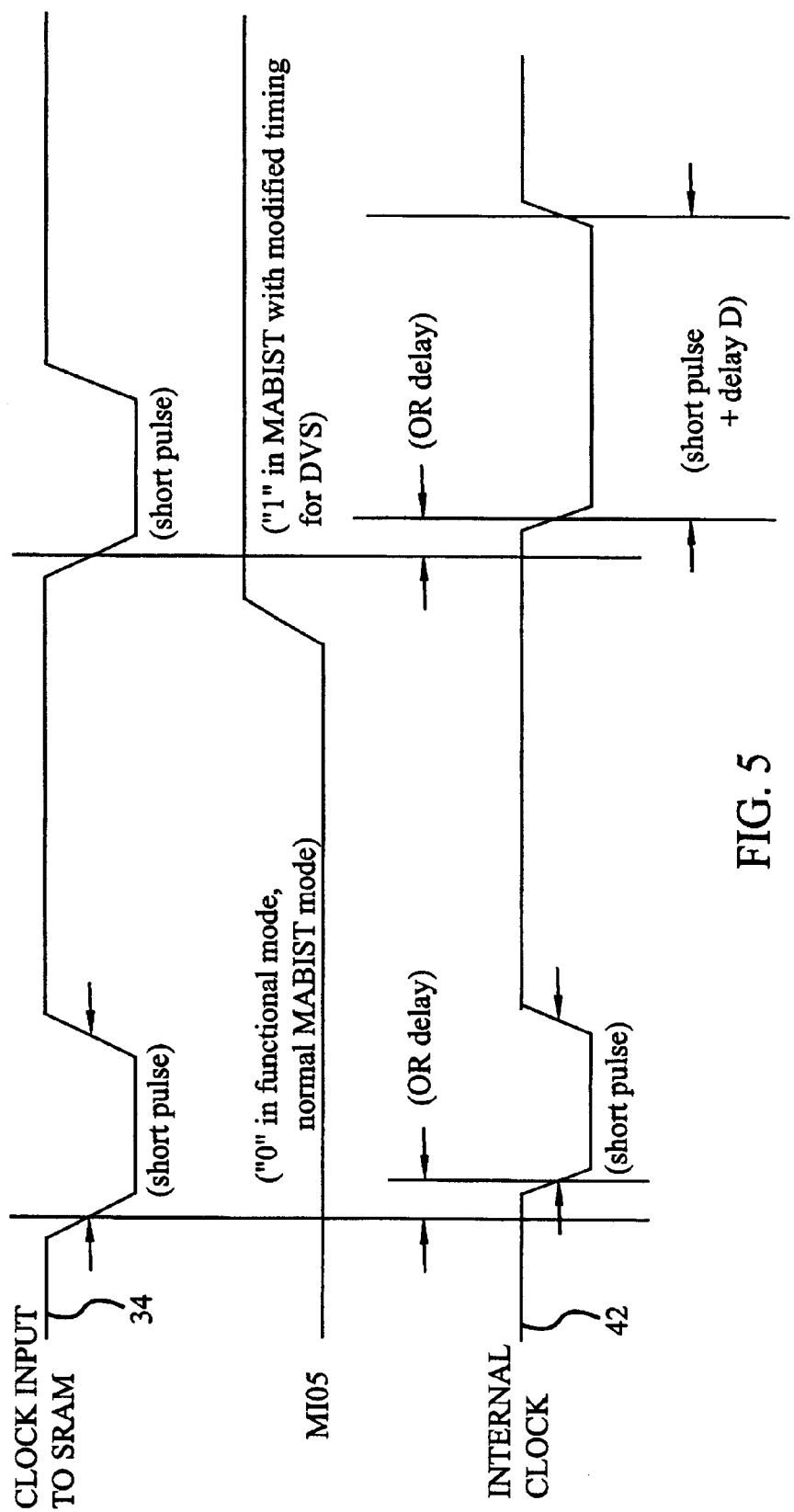
FIG. 5 is a view of the waveforms generated by the device of FIG. 4.

FIG. 4 illustrates an embodiment of the present invention wherein the clock pulse is widened. BIST structure 20 is the same as in FIG. 2, as is interface signal MI05. In the pictured embodiment, clock signal 34 does not pass through multiplexor 40 but feeds straight into an OR-gate 58. Clock signal 34 is buffered to form signal 52, and delayed to form signal 54. Signal 52 is driven to the first input of multiplexor 40, and signal 54 is driven to the second input of multiplexor 40. From multiplexor 40, a delayed signal 56 enters OR-gate 58 along with normal clock signal 34. The output of OR-gate 58 leads into internal clock 42. The delay path through the first input of multiplexor 40 creates a short pulse. The delay path through the second input of multiplexor 40 creates a wider pulse. It would of course be readily apparent to one of ordinary skill in the art to combine the embodiments of FIGS. 2 and 4 into another embodiment where the DVS selected clock pulse is both delayed and widened. FIG. 5 shows waveforms corresponding to the arrangement of FIG. 4.

The present invention may be used to delay or widen a clock pulse during DVS test where timing chains speed up anyway due to higher voltage. During MABIST at normal operating voltage conditions, the normal timings for the SRAM are used. As a result, these normal timings can be made much faster than was previously possible. All other test modes, which either ignore the SRAM operation, or are performed at normal operating conditions, may be run with normal SRAM timings selected.

With the delay of the present invention added during DVS MABIST testing, the test coverage remains the same as before, while during functional mode the cycle time and delay is improved. This access time improvement has been simulated and shown to be as much as 10% for very low voltage operating conditions. This very low voltage operating range is a growing market segment in portable communications devices such as 2-way pagers, cell phones, and palm and laptop computers. The customer gets the benefit of improved performance at low voltage, with improved reliability test coverage.

The foregoing description has described selected embodiments of a device that includes a built-in-self-test controller having a mechanism for providing an interface signal that indicates whether a dynamic voltage screen (DVS) test is being performed. The self-test controller is associated with a memory array that includes a clock having a clock speed. The memory array also includes a clock adjuster that receives the interface signal and reduces the clock speed when the interface signal indicates that a DVS test is being performed.

While the invention has been particularly shown and described with reference to selected embodiments thereof, it will be readily understood by one of ordinary skill in the art that, as limited only by the appended claims, various changes in form and details may be made therein without departing from the spirit and scope of the invention.

What is claimed is:

1. A device comprising:
   (1) a built-in-self-test controller, amid self-test controller including a mechanism for providing an interface signal indicating whether a dynamic voltage screen test is being performed, and
   (2) a memory array including a clock having a clock speed, said memory array further including a clock adjuster receiving said interface signal, said clock adjuster reducing said clock speed when said interface signal indicates a dynamic voltage screen test is being performed.

2. A device comprising:
   (1) a built-in-self-test controller, said self-test controller including a mechanism for providing an interface signal indicating whether a dynamic voltage screen test is being performed; and
   (2) a memory may including a clock having a cloak speed, said memory array further including a clock adjuster having a widened clock pulse receiving said interface signal said clock adjuster reducing said clock speed when aid interface signal indicates a dynamic voltage screen test is being performed.

3. The invention of claim 2, wherein said built-in-self-test controller is a multiple-array-built-in-self-test controller.

4. The invention of claim 2 wherein said clock adjuster comprises a delayed clock pulse.

5. The invention of claim 4 wherein said delayed clock pulse is generated by a normal clock signal and a buffered clock signal acting as inputs to a multiplexor, said multiplexor having an output coupled to an internal clock.

6. The invention of claim 2 wherein amid widened clock pulse is generated by inputting a first signal mud a second signal to an or-gate, said first signal comprising a normal cluck signal from a clock input, said second signal comprising a buffered signal, said buffered signal passing trough an inverting multiplexor, said or-gate having an output coupled to an internal clock.

7. The invention of claim 2 wherein said clock adjuster only adjusts during the dynamic voltage screen test.

8. A method for performing a dynamic voltage screen test on a memory array, said method comprising the steps of:
   (1) generating a multiple-array-built-in-self-test interface signal, said interface signal indicating whether a dynamic voltage screen test is being performed on a memory array; and
   (2) adjusting a clock speed of the memory array by providing a widened clock pulse when the interface signal indicates that a dynamic voltage screen test is being performed.

9. The method of claim 8 wherein said interface signal is generated by an AND-gate in response to at least one input signal received by said AND-gate.

10. The method of claim 2 wherein said clock speed adjustment comprises a delayed clock pulse.

11. A method for performing a dynamic voltage screen test on a memory array, said method comprising the steps of:
   (1) generating a multiple-array-built-in-self-test interface signal, said interface signal indicating whether a dynamic voltage screen test is being performed on a memory array; and
   (2) adjusting a clock speed of the memory array by providing a delayed and widened clock pulse when the interface signal indicates that a dynamic voltage screen test is being performed.

12. A method for testing semiconductor SRAM comprising the steps of:
   (1) slowing down a clock weed of a clock by widening a pulse from said clock such that data may be written and read during a dynamic voltage screen test; and
   (2) tuning critical timing elements to be slower than normal to compensate for the speed up effects at the higher voltage of said dynamic voltage screen test, thereby avoiding undesirable race conditions that would render said SRAM inoperable.

13. A method for testing semiconductor SRAM comprising the steps of:
   (1) slowing down a clock speed of a clock by delaying and widening a pulse from said clock such that data may be written and read during a dynamic voltage screen test: and
   (2) tuning critical timing elements to be slower than normal to compensate for the speed up effects at the higher voltage of said dynamic voltage screen test, thereby avoiding undesirable race conditions that would render said SRAM inoperable.

* * * * *